(12) United States Patent
Ishida et al.

(10) Patent No.: US 9,082,785 B2
(45) Date of Patent: Jul. 14, 2015

(54) HIGH-FREQUENCY CIRCUIT BOARD

(75) Inventors: Yoshiyuki Ishida, Tokyo (JP); Sadao Matsushima, Tokyo (JP); Toshihide Fukuchi, Tokyo (JP)

(73) Assignees: FURUKAWA ELECTRIC CO., LTD., Tokyo (JP); FURUKAWA AUTOMOTIVE SYSTEMS INC., Inukami-gun (JP)

(*) Notice: Subject to any disclaimer, the term of this patent is extended or adjusted under 35 U.S.C. 154(b) by 322 days.

(21) Appl. No.: 13/616,174

(22) Filed: Sep. 14, 2012

(65) Prior Publication Data

US 2013/0000956 A1 Jan. 3, 2013

Related U.S. Application Data

(63) Continuation of application No. PCT/JP2011/055835, filed on Mar. 11, 2011.

(30) Foreign Application Priority Data

Mar. 31, 2010 (JP) ................. 2010-080463

(51) Int. Cl.
*H01P 3/08* (2006.01)
*H01L 23/66* (2006.01)
(Continued)

(52) U.S. Cl.
CPC .............. *H01L 23/66* (2013.01); *H01L 23/552* (2013.01); *H01L 23/642* (2013.01);
(Continued)

(58) Field of Classification Search
CPC .................. H01L 2924/0002; H01L 2924/00; H01L 24/00
USPC .................. 333/236, 238, 245–247
See application file for complete search history.

(56) References Cited

U.S. PATENT DOCUMENTS 6,778,043 B2 * 8/2004 Stoddard et al. .............. 333/246
7,236,070 B2 6/2007 Ajioka et al.
(Continued)

FOREIGN PATENT DOCUMENTS

JP 2002-184900 6/2002
JP 2002-325004 11/2002
(Continued)

OTHER PUBLICATIONS

International Search Report mailed Apr. 12, 2011 in PCT/JP2011/055835 filed Mar. 11, 2011 (in English).

(Continued)

*Primary Examiner* — Dean Takaoka
*Assistant Examiner* — Alan Wong
(74) *Attorney, Agent, or Firm* — Oblon, McClelland, Maier & Neustadt, L.L.P.

(57) ABSTRACT

A high-frequency circuit board capable of easily forming a bias line whose resonance frequency is sufficiently separated from operating frequency is provided. On a high-frequency circuit board 100, by electrically connecting a bias line 11 to a high-frequency circuit 10 using blind via holes 106 and 107, it is possible to limit the route that has a possibility of producing resonance only to the bias line connecting the ends 106a and 107a of the blind via holes 106 and 107 to the bias line 11. By adjusting the route length from the end 106a to the end 107a, it is possible to prevent production of resonance in the vicinity of the operating frequency.

3 Claims, 4 Drawing Sheets

(51) Int. Cl.
*H01L 23/552* (2006.01)
*H01L 23/64* (2006.01)
*H05K 1/02* (2006.01)
*H05K 1/11* (2006.01)
*H01P 1/00* (2006.01)
*H01L 23/498* (2006.01)

(52) U.S. Cl.
CPC ............. *H05K 1/0251* (2013.01); *H05K 1/115* (2013.01); *H01L 23/49822* (2013.01); *H01L 23/49827* (2013.01); *H01L 2223/6616* (2013.01); *H01L 2223/6627* (2013.01); *H01L 2223/6677* (2013.01); *H01L 2924/0002* (2013.01); *H05K 1/024* (2013.01); *H05K 1/0216* (2013.01); *H05K 1/0218* (2013.01); *H05K 1/0243* (2013.01); *H05K 2201/0187* (2013.01); *H05K 2201/0367* (2013.01); *H05K 2201/093* (2013.01); *H05K 2201/09718* (2013.01); *H05K 2201/09781* (2013.01); *H05K 2201/09854* (2013.01); *H05K 2201/10098* (2013.01)

(56) References Cited

U.S. PATENT DOCUMENTS

| | | | |
|---|---|---|---|
| 7,375,290 B1 * | 5/2008 | Kwark et al. | 174/262 |
| 7,579,925 B2 * | 8/2009 | Fan et al. | 333/33 |
| 2004/0136169 A1 | 7/2004 | Morimoto et al. | |
| 2005/0088260 A1 | 4/2005 | Ajioka et al. | |

FOREIGN PATENT DOCUMENTS

| | | |
|---|---|---|
| JP | 2004-146810 A | 5/2004 |
| JP | 2005-19730 | 1/2005 |
| JP | 2005-86603 A | 3/2005 |
| JP | 2010-272585 | 12/2010 |

OTHER PUBLICATIONS

Office Action issued May 23, 2014, in Japanese Patent Application No. 2010-080463 with English translation.
Office Action issued Oct. 25, 2013 in Japanese Patent Application No. 2010-080463 with English language translation.
Extended European Search Report issued Nov. 22, 2013 in Patent Application No. 11762551.7.

\* cited by examiner

HIGH-FREQUENCY CIRCUIT BOARD

TECHNICAL FIELD

The present invention relates to a high-frequency circuit board configured using a multilayer substrate, and more specifically, to a high-frequency circuit board that forms a bias line to prevent degradation of high frequency characteristics.

BACKGROUND ART

Conventionally, on a high-frequency circuit board with a high-frequency circuit on board, a bias line is provided on the substrate side for supplying power to the high-frequency circuit, etc. (Patent Document 1). As a high-frequency pulse radar for vehicle, for example, requires strongly small size substrates, a high-frequency circuit is mounted on one side of the substrate, while an antenna is mounted on the other side to downsize the substrate.

When both a high-frequency circuit and an antenna are mounted on one substrate as described above, it is necessary to prevent the bias line of the high-frequency circuit from being influenced by the electric wave from the antenna as much as possible. Therefore, the technology is known to reduce the influence of the electric wave from the antenna by embedding the bias line in the substrate. A multilayer substrate with three or more layers is used to embed the bias line in the substrate, and the bias line is provided in an internal layer of the multilayer substrate. By providing the bias line in the internal layer, the area needed for the substrate becomes smaller to achieve downsizing.

When the bias line is formed in the internal layer of the multilayer substrate, a microstrip line, a through hole, etc. are formed in the multilayer substrate as an transmission line for electrically connecting the bias line to the high-frequency circuit. The through hole is formed by forming a hole penetrating in the thickness direction of the substrate and coating its inner surface with a given metal. Such a penetrating through hole has the length almost as thick as the thickness of the substrate.

PRIOR ART DOCUMENT

Patent Document

Patent Document 1: Japanese Patent Application Laid-open No. 2002-184900

SUMMARY OF THE INVENTION

Problem to be Solved by the Invention

However, when a penetrating through hole is used for electrically connecting a high-frequency circuit to a bias line, the end of the penetrating through hole may serve as an open end or a short circuit end and produce resonance on the penetrating through hole and a line connected thereto. When the resonance frequency is close to the operating frequency of the high-frequency circuit, resonance may have undesirable influence on the characteristics of the high-frequency circuit.

Especially, on a high-frequency pulse radar, etc. with the high-frequency circuit and the antenna integrated on the substrate, the high-frequency signal emitted from the antenna may produce resonance at the bias line formed with the penetrating through hole, a bias line, etc. The resonance produced at the bias line propagates through the bias line, resulting in degradation of the characteristics of the high-frequency circuit.

The line length of the bias line should be changed to avoid such resonance. Resonance frequency may be changed by changing the line length. By changing the line length of the bias line so that the resonance frequency is sufficiently separated from the operating frequency, resonance that affects high frequency characteristics may be prevented. However, since the length of the penetrating through hole is determined by the thickness of the substrate, the thickness of the substrate must be changed to change the length; therefore, it is extremely difficult to sufficiently separate the resonance frequency from the operating frequency.

The present invention is devised in light of the above-described problem, and has an object to provide a high-frequency circuit board capable of easily forming a bias line whose resonance frequency is sufficiently separated from the operating frequency.

Means for Solving the Problem

To solve the above-described problem, the first aspect of the high-frequency circuit board according to the present invention is a high-frequency circuit board, comprising: a high-frequency circuit arranged on one of outer layers of a multilayer substrate of three or more layers having two outer layers and one or more internal layers; a ground layer provided between the one outer layer and the internal layer; and a bias layer for forming the pattern of a bias line of the high-frequency circuit on an surface different from the surface provided with the ground layer of the internal layer, wherein the high-frequency circuit board at least comprises a transmission line penetrating from the one outer layer to the internal layer having the bias layer and electrically connected to the bias line; and at least the transmission line is formed to meet a given criterion for judging the resonance frequency at the bias line including the end on the one outer layer side of the transmission line and the bias line is sufficiently separated from the operating frequency of the high-frequency circuit.

In another aspect of the high-frequency circuit board according to the present invention, the transmission line is a blind via hole electrically connecting the end on the one outer layer side to the bias line.

In another aspect of the high-frequency circuit board according to the present invention, a blind via hole electrically connecting the end of the one outer layer side to the bias line or a penetrating through hole penetrating from the one outer layer to the other outer layer, and electrically connected to the bias line is used as the transmission line, and a stub is connected to a position of the bias lines connecting the end of the one outer layer side of the blind via hole or the penetrating through hole to the bias line.

In another aspect of the high-frequency circuit board according to the present invention, the stub is formed with a microstrip line to be a short circuit end with a resonance frequency satisfying the criterion.

In another aspect of the high-frequency circuit board according to the present invention, the stub is formed with a given condenser to be a short circuit end with the resonance frequency satisfying the criterion.

In another aspect of the high-frequency circuit board according to the present invention, a penetrating through hole penetrating from the one outer layer to the other outer layer and electrically connected to the bias line is used as the transmission line, and a metallic pin with a given length is connected to the end on the other outer layer side of the penetrating through hole.

In another aspect of the high-frequency circuit board according to the present invention, a penetrating through hole penetrating from the one outer layer to the other outer layer and electrically connected to the bias line is used as the transmission line, and a dielectric is arranged having a permittivity different from permittivity of the two outer layers and the internal layer around the penetrating through hole.

In another aspect of the high-frequency circuit board according to the present invention, when the operating frequency is denoted by fa and the resonance frequency is denoted by f, the criterion is given by $$f < fa \times 0.8 \text{ or } f > fa \times 1.2.$$

In another aspect of the high-frequency circuit board according to the present invention, an antenna is arranged on the other outer layer.

Effect of the Invention

According to the present invention, there is provided a high-frequency circuit board capable of easily forming a bias line whose resonance frequency is sufficiently separated from the operating frequency.

BEST MODE FOR CARRYING OUT THE INVENTION

Figure 1:
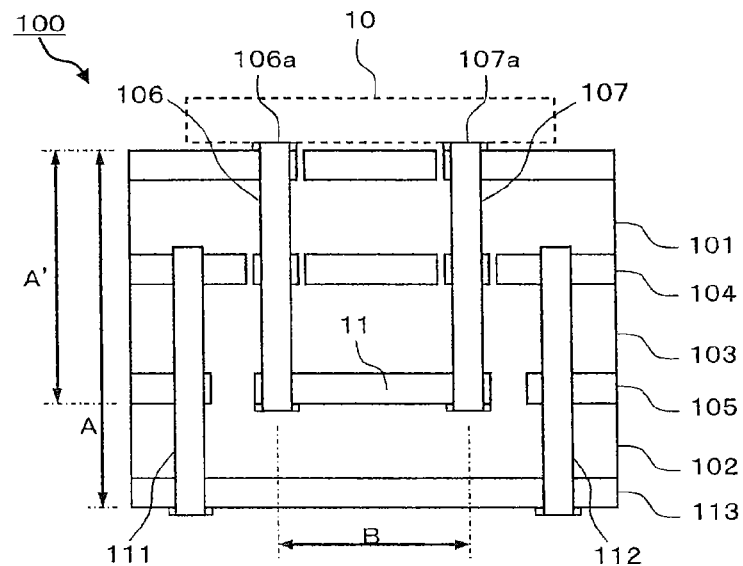
FIG. 1 is a cross-sectional view of a high-frequency circuit board according to a first embodiment of the present invention.

A high-frequency circuit board according to preferred embodiments of the present invention will be explained in detail with reference to the drawings. Components with the same function are denoted by the same reference numeral for the purpose of simplicity.

Figure 7:
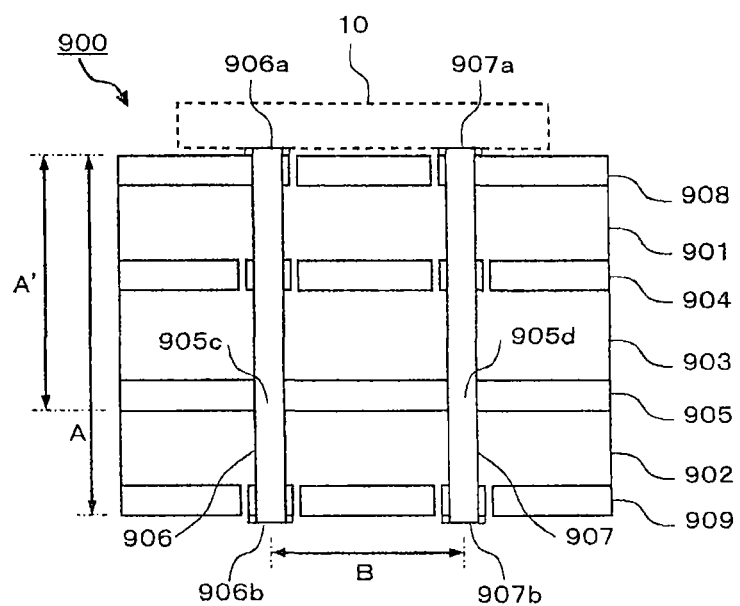
FIG. 7 is a cross-sectional view of a conventional high-frequency circuit board.

For comparison with the high-frequency circuit board of the present invention, the structure of the conventional high-frequency circuit board is first explained using FIG. 7. FIG. 7 is a cross-sectional view of a conventional high-frequency circuit board 900 vertically cut in the position to mount a high-frequency circuit. The high-frequency circuit board 900 is a multilayer substrate including three layers with one internal layer 903 arranged between two outer layers 901 and 902. Hereinafter, the two outer layers are referred to as one outer layer 901 and the other outer layer 902, respectively. A ground layer 904 with the ground formed is provided between the one outer layer 901 and the internal layer 903.

A given high-frequency circuit 10 is mounted on the high-frequency circuit board 900. Here, the high-frequency circuit 10 is assumed to be mounted on the surface of the one outer layer 901. And, a bias layer 905 with a pattern of the bias line of the high-frequency circuit 10 formed is provided between the internal layer 903 and the other outer layer 902. Conventionally, penetrating through holes 906 and 907 penetrating the high-frequency circuit board 900 were provided to electrically connect the bias layer 905 to the high-frequency circuit 10. The penetrating through holes 906 and 907 are formed by metal plating the inner surfaces of the through bores penetrating the one outer layer 901, the internal layer 903, and the other outer layer 902, and are electrically connected to the high-frequency circuit 10 and the bias layer 905.

In FIG. 7, the end on the one outer layer 901 side of the penetrating through hole 906 is denoted by 906a, and the end on the other outer layer 902 side is denoted by 906b. In the same manner, the end on the one outer layer 901 side of the penetrating through hole 907 is denoted by 907a, and the end on the other outer layer 902 side is denoted by 907b. In addition, the connecting points between the penetrating through holes 906 and 907, and the bias layer 905 are denoted by 905c and 905d, respectively. Moreover, the thickness between the surface of the one outer layer 901 and the surface of the other outer layer 902 is denoted by A, the thickness from the surface of the one outer layer 901 to the bias layer 905 is denoted by A', and the gap between the penetrating through holes 906 and 907 is denoted by B. Here, the thickness A and A' include the thickness of conductor layers 908 and 909 formed on the surfaces of the outer layers 901 and 902 (which is applied hereinafter).

In the above described conventional high-frequency circuit boards 900, although the ends 906b and 907b on the other outer layer 902 side are both open ends, the ends 906a and 907a on the one outer layer 901 side are decided either to be an open end (open) or a short circuit end (short) in a high frequency manner by the high-frequency circuit 10. Therefore, depending on the structure of the high-frequency circuit 10, resonance may occur in any one of the routes connecting each end of the bias line including the bias layer 905 and the penetrating through holes 906 and 907. That is to say, resonance occurs in any of the routes connecting each end with its resonance frequency close to the operating frequency. Such resonance causes an unnecessary high frequency signal to be overlapped on the bias line formed in the bias layer 905, and gives a bad influence on the characteristics of the high-frequency circuit 10.

For example, when the operating frequency is 26.5 GHz, the thickness A and A' are 1.5 mm and 0.5 mm, respectively, and the gap B is 1.2 mm, as explained below, a route in which resonance is produced with the frequency near the operating frequency is formed.

In the bias line including the bias layer 905 and the penetrating through holes 906 and 907, the routes between ends in which resonance may be produced include six routes shown in the Resonance Route column of Table 1. That is, resonance may occur in six routes: the route connecting the ends 906a and 906b of the penetrating through hole 906; the route connecting the ends 907a and 907b of the penetrating through hole 907; the route from the end 906a via the connecting points 905c and 905d to the end 907a; the route from the end 906a via the connecting points 905c and 905d to the end 907b; the route from the end 907a via the connecting points 905d and 905c to the end 906b; and the route from the end 906b via the connecting points 905c and 905d to the end 907b. The physical length Si (i=1 to 6) of each route is shown in the Physical Length column of Table 1.

TABLE 1

| | | | Resonance Route | | | | | |
|---|---|---|---|---|---|---|---|---|
| | 906a | 907a | 906a-906b | 907a-907b | 906a-907a | 906a-907b | 907a-906b | 906b-907b |
| Resonance Frequency (GHz) | Short Circuit End | Short Circuit End | 26.14 | 26.14 | 35.64 | 14.52 | 14.52 | 24.50 |
| | Short Circuit End | Open End | 26.14 | 52.27 | 17.82 | 14.52 | 29.04 | 24.50 |
| | Open End | Open End | 52.27 | 52.27 | 35.64 | 29.04 | 29.04 | 24.50 |
| Physical Length (mm) | | | 1.5 | 1.5 | 2.2 | 2.7 | 2.7 | 3.2 |

With the physical length Si (i=1 to 6) of each route, each electric length Li (i=1 to 6) may be calculated using the following formula.

$$Li = Si \times \sqrt{\in eff} \quad (1)$$

Where, $\in eff$ denotes a relative effective permittivity of dielectric forming the outer layers 901 and 902 and the internal layer 903. With the electric length Li (i=1 to 6) of the formula (1), the resonance frequency fi (i=1 to 6) of each route is calculated as follows. The resonance frequency of each route is calculated with one of the following formulas depending on each of the both ends is an open end or a short circuit end.

First, the resonance frequency fi when one end of the route is a short circuit end and the other is an open end is calculated by $$fi = c/(4 \times Li) \quad (2)$$

When the both ends of the route are short circuit ends or open ends, it is calculated by $$fi = c/(2 \times Li) \quad (3)$$

The c indicates the velocity of light in the formulas described above.

The resonance frequencies of six routes are shown in the Resonance Frequency column of Table 1 when the ends 906a and 907a on the one outer layer 901 side of the penetrating through holes 906 and 907 are short circuit end or an open end. However, the same resonance frequency may be obtained although routes are different between when the end 906a is a short circuit end and the end 907a is an open end and when the end 906a is an open end and the end 907a is a short circuit end; therefore, Table 1 only shows the case when the end 906a is a short circuit end and the end 907a is an open end.

From Table 1, when the end 906a and 907a are both short circuit ends, or when one is a short circuit end and the other is an open end, there is a route which resonates on the frequency of 26.1 GHz which is close to the operating frequency of 26.5 GHz. As a result, resonance at 26.1 GHz has undesirable influence on the high-frequency circuit 10. The high-frequency circuit board of the present invention is configured to prevent production of resonance in the vicinity of the operating frequency as described above.

(First Embodiment)

A high-frequency circuit board according to a first embodiment of the present invention is explained below with reference to FIG. 1. FIG. 1 is a cross-sectional view of a high-frequency circuit board 100 of this embodiment vertically cut in the position to mount a high-frequency circuit 10. The high-frequency circuit board 100 of this embodiment is a multilayer substrate including three layers with one internal layer 103 arranged between two outer layers 101 and 102. A ground layer 104 with the ground formed is provided between the one outer layer 101 and the internal layer 103. The high-frequency circuit board 100 of this embodiment uses a substrate of three layer structure with only one internal layer 103, but not limited thereto, and may be a multilayer substrate of four or more layers provided with two or more internal layers.

In this embodiment, the high-frequency circuit 10 is mounted on the surface of the one outer layer 101. And a bias layer 105 with a pattern of the bias line 11 of the high-frequency circuit 10 formed is provided between the internal layer 103 and the other outer layer 102. An antenna is arranged at the other outer layer 102.

In this embodiment, blind via holes 106 and 107 are provided between the one outer layer 101 and the bias layer 105 to electrically connect the bias layer 105 to the high-frequency circuit 10. The blind via holes 106 and 107 penetrate the one outer layer 101 and the internal layer 103, are electrically connected to the bias line 11, and do not penetrate the other outer layer 102. In addition, the blind via holes 106 and 107 are separated from the ground layer 104 not to connect to the lines other than the bias line 11 of the bias layer 105. Thereby, the ends of the bias line formed with the blind via holes 106 and 107 and the bias line 11 are only the ends 106a and 107a on the one outer layer 101 side of the blind via holes 106 and 107. Therefore, the only route in which resonance may be produced is a route formed with the blind via holes 106 and 107 and the bias line 11 between the ends 106a and 107a.

In the same manner as the conventional example shown in FIG. 7, when the operating frequency is 26.5 GHz, the thickness A between the surface of the one outer layer 101 and the surface of the other outer layer 102 is 1.5 mm, the thickness A' from the surface of the one outer layer 101 to the bias layer 105 is 0.5 mm, and the gap B between the blind via holes 106 and 107 is 1.2 mm, the resonance frequency produced on the route between the end 106a of the blind via hole 106 and the end 107a of the blind via hole 107 is as shown in Table 2. As shown in Table 2, in this embodiment, the resonance frequencies of the route between the ends 106a and 107a in which resonance may be produced are sufficiently separated from the operating frequency of 26.5 GHz whether the end 106a and 107a are a short circuit end or an open end.

TABLE 2

|  | 106a | 107a | Resonance Route 106a-107a |
|---|---|---|---|
| Resonance Frequency (GHz) | Short Circuit End | Short Circuit End | 35.64 |
|  | Short Circuit End | Open End | 17.82 |
|  | Open End | Open End | 35.64 |
| Physical Length (mm) |  |  | 2.2 |

When the operating frequency denoted by fa, $$fi < fa \times 0.8 \text{ or } fi > fa \times 1.2 \quad (4)$$

may be used as a criterion to judge that the resonance frequency fi calculated with the formula (2) or (3) is sufficiently separated from the operating frequency fa. That is to say, when the resonance frequency is separated from the operating frequency by not less than 20 percent, the resonance frequency is judged to be sufficiently separated from the operating frequency. In this case, there is no possibility that resonance may be produced by the electric wave of the operating frequency, and even if resonance is produced, there is no possibility of having undesirable influence on the high-frequency circuit 10.

As described above, in the high-frequency circuit board 100 according to this embodiment, the bias line 11 is electrically connected to the high-frequency circuit 10 using the blind via holes 106 and 107 so that it is possible to limit the route that has a possibility of producing resonance only to the bias line connecting the ends 106a and 107a of the blind via holes 106 and 107 to the bias line 11. By adjusting the route length from the end 106a to 107a, it is possible to prevent production of resonance in the vicinity of the operating frequency.

The high-frequency circuit board 100 according to this embodiment prevents resonance from being produced in the vicinity of the operating frequency as described above as well as has a structure to reduce the influence of the electric wave from surroundings. In this embodiment, other blind via holes 111 and 112 are provided from the other outer layer 102 side to the ground layer 104 in addition to the blind via holes 106 and 107. And a ground layer 113 is formed on part of the surface of the other outer layer 102. Thereby, the ground layers 104 and 113 are electrically connected by the blind via holes 111 and 112, and the bias line 11 is surrounded by the ground layers 104 and 113 and the blind via holes 111 and 112.

As described above, since the bias line formed with the bias line 11 and the blind via holes 106 and 107 is surrounded by the ground layers 104 and 113 and the blind via holes 111 and 112 when seen from the other outer layer 12 side, the electric wave from the antenna arranged on part of the surface of the other outer layer 102 is shielded to achieve reduction of the influence on the high-frequency circuit.

(Second Embodiment)

Figure 2:
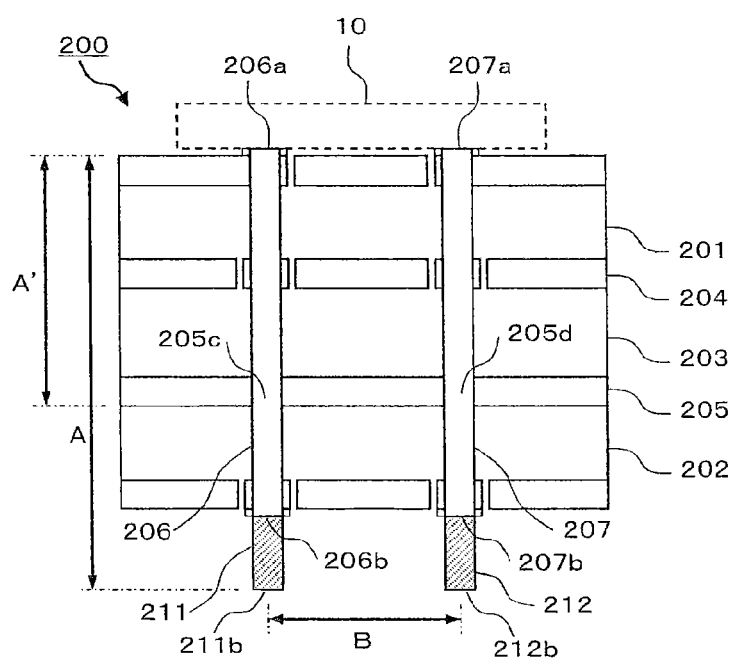
FIG. 2 is a cross-sectional view of a high-frequency circuit board according to a second embodiment of the present invention.

A high-frequency circuit board according to a second embodiment of the present invention is explained below with reference to FIG. 2. FIG. 2 is a cross-sectional view of a high-frequency circuit board 200 of this embodiment vertically cut in the position to mount a high-frequency circuit 10. The high-frequency circuit board 200 according to this embodiment has the same structure as the conventional high-frequency circuit board 900 shown in FIG. 7, and includes a multilayer substrate of three layers with one internal layer 203 arranged between two outer layers 201 and 202. A ground layer 204 is provided between the one outer layer 201 and the internal layer 203, and a bias layer 205 is provided between the internal layer 203 and the other outer layer 202.

In this embodiment, penetrating through holes 206 and 207 penetrating the two outer layers 201 and 202 and the internal layers 203 are provided in the same manner as the conventional high-frequency circuit board 900 to electrically connect the bias layer 205 to the high-frequency circuit 10. The end on the one outer layer 201 side of the penetrating through hole 206 is denoted by 206a, and the end on the other outer layer 202 side is denoted by 206b. In the same manner, the end on the one outer layer 201 side of the penetrating through hole 207 is denoted by 207a, and the end on the other outer layer 202 side is denoted by 207b. In addition, the connecting points of the penetrating through holes 206 and 207 and the bias layer 205 are denoted by 205c and 205d, respectively.

In the high-frequency circuit board 200 according to this embodiment, in addition to having the same structure as the conventional high-frequency circuit board 900, metallic pins 211 and 212 are connected to ends 206b and 207b on the other outer layer 202 side of the penetrating through holes 206 and 207. By connecting such metallic pins 211 and 212 to the ends 206b and 207b of the penetrating through hole, the electric length of the route in which resonance is produced via the penetrating through holes 206 and 207 may be changed. Hereinafter, the open ends of the metallic pins 211 and 212 are denoted by 211b and 212b, respectively.

As described above, when the metallic pins 211 and 212 are connected to the ends 206b and 207b of the penetrating through holes 206 and 207, the electric length of the routes with the end 906b or 907b among the six resonance routes shown in Table 1 is replaced by that of the routes with the open end 211b or 212b, respectively. Thereby, the physical length of the resonance route concerned becomes longer by the length of the metallic pins 211 and 212. As a result, the resonance frequency of the resonance route concerned changes. When the lengths of the metallic pins 211 and 212 are 2.5 mm, respectively, the physical length and resonance frequency of the six resonance routes in the high-frequency circuit board 200 have values as shown in Table 3.

TABLE 3

|  |  | 206a | 207a | Resonance Route | | | | | |
|---|---|---|---|---|---|---|---|---|---|
|  |  |  |  | 206a-206b | 207a-207b | 206a-207a | 206a-207b | 207a-206b | 206b-207b |
| Resonance Frequency (GHz) | | Short Circuit End | Short Circuit End | 9.80 | 9.80 | 35.64 | 7.54 | 7.54 | 9.56 |
|  |  | Short Circuit End | Open End | 9.80 | 19.60 | 17.82 | 7.54 | 15.08 | 9.56 |
|  |  | Open End | Open End | 19.60 | 19.60 | 35.64 | 15.08 | 15.08 | 9.56 |
| Physical Length (mm) | | | | 4.0 | 4.0 | 2.2 | 5.2 | 5.2 | 8.2 |

As shown in Table 3, by connecting the metallic pins 211 and 212 to the end 206b and 207b of the penetrating through holes 206 and 207, there is no resonance route having the resonance frequency near the operating frequency of 26.5 GHz in any of the six resonance routes, and all of them satisfy the condition of the formula (4). As a result, resonance may be prevented in the vicinity of the operating frequency.

physical length and resonance frequency of each resonance route are shown in Table 4. Here, the resonance frequency is calculated assuming that the electric length of the microstrip line forming the stub, or the resonance frequency of the condenser is set so that the connecting point 311c of the stub 311 will be a short circuit end in each of the three resonance routes.

TABLE 4

|  | 306a | 307a | 311c | Resonance Route | | | |
|---|---|---|---|---|---|---|---|
|  |  |  |  | 306a-311c | 307a-311c | 906b-311c | 307b-311c |
| Resonance Frequency (GHz) | Short Circuit End | Short Circuit End | Short Circuit End | 156.81 | 35.64 | 39.20 | 17.82 |
|  | Short Circuit End | Open End | Short Circuit End | 156.81 | 17.82 | 39.20 | 17.82 |
|  | Open End | Open End | Short Circuit End | 78.41 | 17.82 | 39.20 | 17.82 |
| Physical Length (mm) | | | | 0.5 | 1.7 | 1.0 | 2.2 |

(Third Embodiment)

Figure 3:
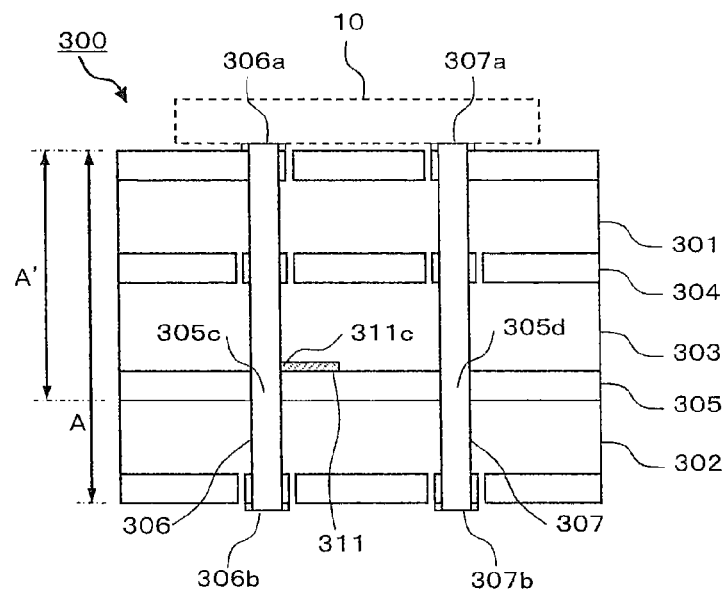
FIG. 3 is a cross-sectional view of a high-frequency circuit board according to a third embodiment of the present invention.

A high-frequency circuit board according to a third embodiment of the present invention is explained below with reference to FIG. 3. FIG. 3 is a cross-sectional view of a high-frequency circuit board 300 of this embodiment vertically cut in the position to mount a high-frequency circuit 10. The high-frequency circuit board 300 according to this embodiment also has the same structure as the conventional high-frequency circuit board 900 shown in FIG. 7, and includes a multilayer substrate of three layers with one internal layer 303 arranged between two outer layers 301 and 302. A ground layer 304 is provided between the one outer layer 301 and the internal layer 303, and a bias layer 305 is provided between the internal layer 303 and the other outer layer 302. In addition, penetrating through holes 306 and 307 penetrating the two outer layers 301 and 302 and the internal layer 303 are provided to electrically connect the bias layer 305 to the high-frequency circuit 10.

In this embodiment, a stub 311 is provided instead of the metallic pins 211 and 212 used in the second embodiment. The stub 311, when there is a resonance route having the resonance frequency near the operating frequency, is connected in the middle of the resonance route so that a connecting point 311c of the stub 311 will be a short circuit end in the resonance frequency. In this embodiment, the stub 311 is provided in any of the route from an end 306a via the penetrating through hole 306, the bias layer 305, and a penetrating through hole 307 to an end 307a. In FIG. 3, the connecting point 311c of the stub 311 is provided at a connecting point 305c to which the penetrating through hole 306 and the bias layer 305 are connected.

When the stub 311 is formed with a microstrip line, the length of the microstrip line is one fourth of the electric length Li calculated with the formula (1). In addition, when the stub 311 is formed with a condenser, a condenser having the resonance frequency fi calculated with the formula (2) or (3) is used.

By providing the above described stub 311, the connecting point 311c of the stub 311 serves as short circuit end. As a result, one end of the resonance route will be the connecting point 311c, and the other end will be any one of both ends 306a and 306b of the penetrating through hole 306 and both ends 307a and 307b of the penetrating through hole 307. The As shown in Table 4, the resonance frequencies of all resonance routes satisfy the condition of the formula (4), and each resonance frequency may be judged to be sufficiently separated from the operating frequency. Thereby, the high-frequency circuit board 300 according to this embodiment may also prevent resonance having a bad influence on the high-frequency circuit 10. In addition, in this embodiment, although the penetrating through holes 306 and 307 are used for electrically connecting the high-frequency circuit 10 to the bias layer 305, blind via holes may be used in the same manner as in the first embodiment instead.

(Fourth Embodiment)

Figure 4:
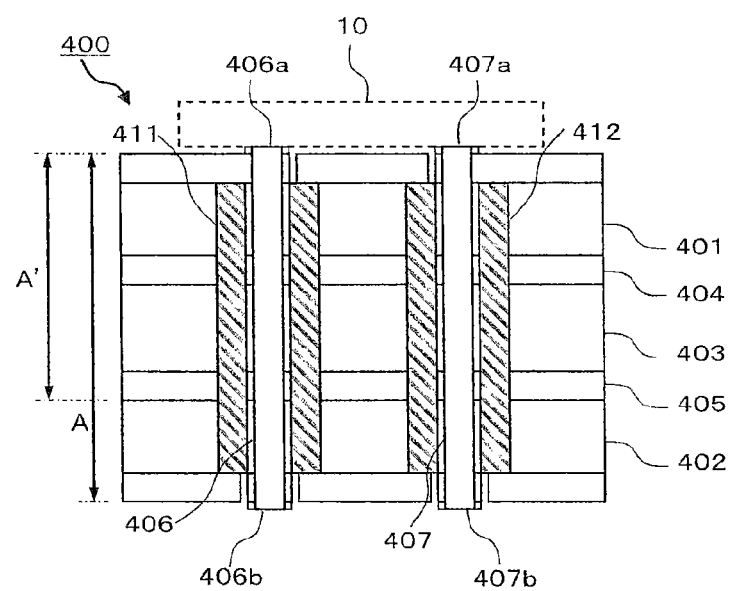
FIG. 4 is a cross-sectional view of a high-frequency circuit board according to a fourth embodiment of the present invention.

A high-frequency circuit board according to a fourth embodiment of the present invention is explained below with reference to FIG. 4. FIG. 4 is a cross-sectional view of a high-frequency circuit board 400 of this embodiment vertically cut in the position to mount a high-frequency circuit 10. The high-frequency circuit board 400 according to this embodiment also has the same structure as the conventional high-frequency circuit board 900 shown in FIG. 7, and includes a multilayer substrate of three layers with one internal layer 403 arranged between two outer layers 401 and 402. A ground layer 404 is provided between the one outer layer 401 and the internal layer 403, and a bias layer 405 is provided between the internal layer 403 and the other outer layer 402. In addition, penetrating through holes 406 and 407 penetrating the two outer layers 401 and 402 and the internal layers 403 are provided to electrically connect the bias layer 405 to the high-frequency circuit 10.

In this embodiment, other through bores 411 and 412 are provided around the penetrating through holes 406 and 407, and a dielectric with a permittivity different from that of the outer layers 401 and 402 and the internal layer 403 is filled therein. Thus, by providing the dielectric with a different permittivity around the penetrating through holes 406 and 407 with a small distance therebetween, the electric length of the penetrating through holes 406 and 407 may be changed. When the relative effective permittivity of the dielectric to fill the other through bores 411 and 412 are denoted by ∈eff, the electric length Li (i=1 to 6) of each resonance route is calculated with the following formula using the physical length Si (i=1 to 6) of each route.

$$Li = Si \times \sqrt{\in eff} \quad (5)$$

In this regard, when only the same dielectric as the outer layers 401 and 402 and the internal layer 403 is arranged around the bias layer 405, the electric length of the bias layer 405 is calculated using the formula (1). The electric length of each route is calculated from the electric length of the bias layer 405 and the electric length of the penetrating through holes 406 and 407 calculated by the formula (5). As described above, by providing the dielectric with a different permittivity around the penetrating through holes 406 and 407 with a small distance therebetween, the frequency of the resonance produced in the route via the penetrating through holes 406 and 407 may be changed to a different value.

As an example of the dielectric with a different permittivity, the resonance frequency when using a dielectric with a high relative permittivity (relative effective permittivity ∈eff′≈30), such as titanium oxide, is shown in Table 5.

TABLE 5

|  | 406a | 407a | Resonance Route | | | | | |
|---|---|---|---|---|---|---|---|---|
|  |  |  | 406a-406b | 407a-407b | 406a-407a | 406a-407b | 407a-406b | 406b-407b |
| Resonance Frequency (GHz) | Short Circuit End | Short Circuit End | 9.13 | 9.13 | 7.82 | 5.07 | 5.07 | 8.56 |
|  | Short Circuit End | Open End | 9.13 | 18.26 | 3.91 | 5.07 | 10.14 | 8.56 |
|  | Open End | Open End | 18.26 | 18.26 | 7.82 | 10.14 | 10.14 | 8.56 |
| Physical Length (mm) |  |  | 1.5 | 1.5 | 3.5 | 2.7 | 2.7 | 3.2 |

As shown in Table 4, the resonance frequencies of all resonance routes satisfy the condition of the formula (4), and each resonance frequency may be judged to be sufficiently separated from the operating frequency. Thereby, the high-frequency circuit board 400 according to this embodiment may also prevent resonance having a bad influence on the high-frequency circuit 10.

Figure 5:
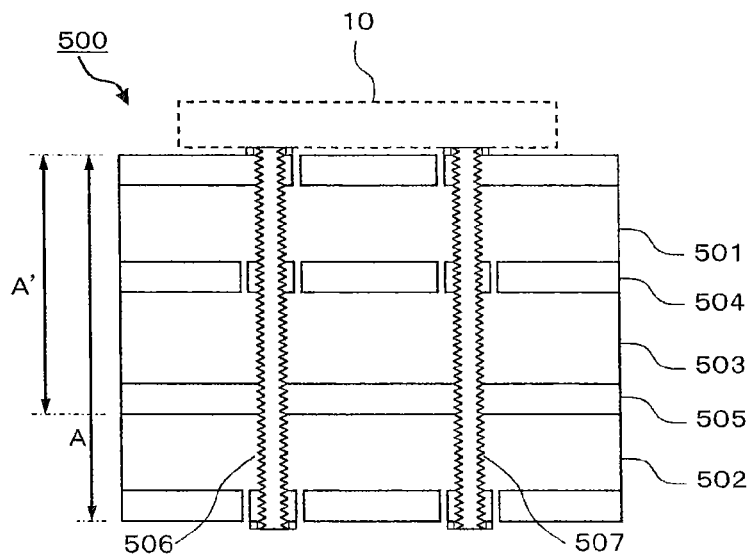
FIG. 5 is a cross-sectional view of a high-frequency circuit board according to another embodiment of the present invention.
Figure 6:
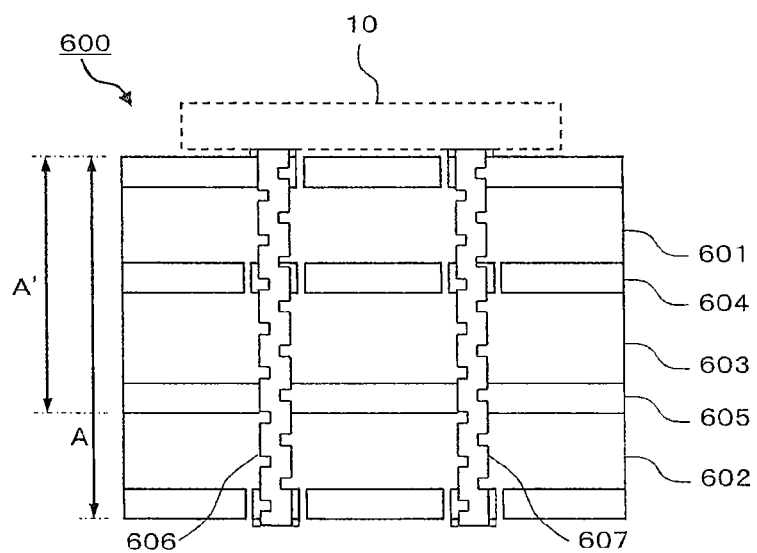
FIG. 6 is a cross-sectional view of a high-frequency circuit board according to still another embodiment of the present invention.

Still another embodiment of the high-frequency circuit board according to the present invention is shown in FIGS. 5 and 6. FIGS. 5 and 6 are cross-sectional views of high-frequency circuit boards 500 and 600 of another embodiment vertically cut in the position to mount a high-frequency circuit 10, respectively. Each of the high-frequency circuit boards 500 and 600 has the same structure as conventional high-frequency circuit board 900 shown in FIG. 7, and has two outer layers 501 and 502, and 601 and 602, internal layers 503 and 603, ground layers 504 and 604, and bias layers 505 and 605, respectively.

In the high-frequency circuit board 500 shown in FIG. 5, penetrating through holes 506 and 507 for electrically connecting the bias layer 505 to the high-frequency circuit 10 are formed with through bores formed in the shape of a screw hole. The penetrating through holes 506 and 507 formed in this way have the physical length longer than the substrate thickness A, and resonance frequency may be changed by changing the electric length. As a result, resonance having a bad influence on the high-frequency circuit 10 may be prevented by sufficiently separating the resonance frequency from the operating frequency.

In addition, in the high-frequency circuit board 600 shown in FIG. 6, penetrating through holes 606 and 607 for electrically connecting the bias layer 505 to the high-frequency circuit 10 are formed by through bores formed in a meandering shape. The penetrating through holes 606 and 607 formed in this way have the physical length longer than the substrate thickness A, and the resonance frequency may be changed by changing the electric length. As a result, resonance having a bad influence on high-frequency circuit 10 may be prevented by sufficiently separating the resonance frequency from the operating frequency.

According to the high-frequency circuit board of the present invention described above, in any embodiment, resonance having a bad influence on the high-frequency circuit 10 may be prevented by sufficiently separating the resonance frequency from the operating frequency. Thereby, even when an antenna is mounted on the surface of the substrate opposite to the surface in which the high-frequency circuit is mounted to integrate the antenna and the high-frequency circuit board, overlapping of the high frequency signal from the antenna to the bias line may be prevented.

The description in these embodiments only represents examples of the high-frequency circuit board according to the present invention, and is not limited thereto. Details of the structure and detailed operation, etc. of the high-frequency circuit board according to these embodiments may be suitably changed without departing from the spirit of the present invention.

REFERENCE NUMERALS

10: High-frequency circuit
11: Bias line
100, 200, 300, 400, 500, 600: High-frequency circuit board
101, 102, 201, 202, 301, 302, 401, 402, 501, 502, 601, 602: Outer layer
103, 203, 303, 403, 503, 603: Internal layer
104, 113, 204, 304, 404, 504, 604: Ground layer
105, 205, 305, 405, 505, 605: Bias layer
106, 107, 111, 112: Blind via hole
206, 207, 306, 307, 406, 407, 506, 507, 606, 607: Penetrating through hole
211, 212: Metallic pin
311: Stub
411, 412: Another through bore

The invention claimed is:

1. A high-frequency circuit board, comprising:
   a high-frequency circuit arranged on one outer layer of a multilayer substrate of three or more layers having two outer layers and one or more internal layers;
   a ground layer provided between the one outer layer and the internal layer;
   a bias layer for forming a pattern of a bias line of the high-frequency circuit on a surface different from the surface provided with the ground layer of the internal layer;
   a transmission line including a penetrating through hole penetrating from the one outer layer to the other outer layer and electrically connected to the bias line; and a dielectric that is arranged around the penetrating through hole, permittivity of the dielectric being such that resonance frequency f at a line including at least an end on the one outer layer side of the transmission line and the bias line satisfies a criterion given by $f<fa\times0.8$ or $f>fa\times1.2$, where fa denotes an operating frequency of the high-frequency circuit.

2. A high-frequency circuit board, comprising:

a high-frequency circuit arranged on one outer layer of a multilayer substrate of three or more layers having two outer layers and one or more internal layers;

a ground layer provided between the one outer layer and the internal layer;

a bias layer for forming a pattern of a bias line of the high-frequency circuit on a surface different from the surface provided with the ground layer of the internal layer; and a transmission line including a penetrating through hole penetrating from the one outer layer to the other outer layer and electrically connected to the bias line, wherein the penetrating through hole is formed in a screw hole shape, and an electric length of the penetrating through hole is such that resonance frequency f at a line including at least an end on the one outer layer side of the transmission line and the bias line satisfies a criterion given by $f<fa\times0.8$ or $f>fa\times1.2$, where fa denotes an operating frequency of the high-frequency circuit.

3. A high-frequency circuit board, comprising:

a high-frequency circuit arranged on one outer layer of a multilayer substrate of three or more layers having two outer layers and one or more internal layers;

a ground layer provided between the one outer layer and the internal layer;

a bias layer for forming a pattern of a bias line of the high-frequency circuit on a surface different from the surface provided with the ground layer of the internal layer; and a transmission line including a penetrating through hole penetrating from the one outer layer to the other outer layer and electrically connected to the bias line, wherein the penetrating through hole is formed in a meandering shape, and an electric length of the penetrating through hole is such that resonance frequency f at a line including at least an end on the one outer layer side of the transmission line and the bias line satisfies a criterion given by $f<fa\times0.8$ or $f>fa\times1.2$, where fa denotes an operating frequency of the high-frequency circuit.

* * * * *